US012800615B2

(12) United States Patent
Lou

(10) Patent No.: US 12,800,615 B2
(45) Date of Patent: Nov. 17, 2026

(54) PROBE CARD STRUCTURE

(71) Applicant: STAR TECHNOLOGIES, INC., Hsinchu City (TW)

(72) Inventor: Choon Leong Lou, Singapore (SG)

(73) Assignee: XINGR HOLDINGS PTE. LTD., Singapore (SG)

( * ) Notice: Subject to any disclaimer, the term of this patent is extended or adjusted under 35 U.S.C. 154(b) by 105 days.

(21) Appl. No.: 18/541,146

(22) Filed: Dec. 15, 2023

(65) Prior Publication Data

US 2025/0052785 A1 Feb. 13, 2025

(30) Foreign Application Priority Data

Aug. 9, 2023 (TW) ................................ 112129888

(51) Int. Cl.
*G01R 1/073* (2006.01)

(52) U.S. Cl.
CPC ..... *G01R 1/07371* (2013.01); *G01R 1/07342* (2013.01)

(58) Field of Classification Search
CPC ............ G01R 1/07307; G01R 1/06772; G01R 1/07371; G01R 1/07314; G01R 1/073; G01R 1/07342
USPC .......................... 324/756.03, 755.02, 756.06
See application file for complete search history.

(56) References Cited

U.S. PATENT DOCUMENTS

| | | | | |
|---|---|---|---|---|
| 7,250,780 B2 * | 7/2007 | Hembree | G01R 31/2886 324/762.05 |
| 11,782,074 B2 * | 10/2023 | Inuma | H01R 33/76 324/537 |
| 2007/0145991 A1 * | 6/2007 | Yoshida | G01R 1/045 324/755.01 |
| 2010/0001742 A1 * | 1/2010 | Strid | G01R 35/005 324/601 |
| 2013/0065455 A1 * | 3/2013 | Kawata | H01R 13/2421 439/700 |
| 2019/0302185 A1 * | 10/2019 | Maggioni | G01R 1/07371 |
| 2020/0225265 A1 * | 7/2020 | Hironaka | G01R 1/07314 |
| 2022/0074971 A1 * | 3/2022 | Shuto | G01R 1/06772 |
| 2022/0413008 A1 * | 12/2022 | Kim | G01R 1/06755 |
| 2026/0133222 A1 * | 5/2026 | Shang | G01R 1/0675 |

* cited by examiner

*Primary Examiner* — Roberto Velez
(74) *Attorney, Agent, or Firm* — Li & Cai Intellectual Property (USA) Office

(57) ABSTRACT

A probe card structure is provided. The probe card structure includes a first guide plate having a plurality of first guide plate through holes, a second guide plate having a plurality of second guide plate through holes, at least one signal probe and at least one ground probe. At least one of a first area of the first guide plate defined by a first quantity of the first guide plate through holes and a first area of the second guide plate defined by a first quantity of the second guide plate through holes is plated with a guide plate conductive film. A plurality of signal probes plated with a probe conductive film correspondingly pass through a part of the first quantity of the first guide plate through holes and a part of the first quantity of the second guide plate through holes.

6 Claims, 7 Drawing Sheets

PROBE CARD STRUCTURE

CROSS-REFERENCE TO RELATED PATENT APPLICATION

This application claims the benefit of priority to Taiwan Patent Application No. 112129888, filed on Aug. 9, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card for testing semiconductor components, in particular to a probe card structure sharing ground probes.

BACKGROUND OF THE DISCLOSURE

Electrical testing is an important step in the process of manufacturing integrated circuit chips (IC chips). A probe card is a test device used for electrical testing of semiconductor components and is used to evaluate whether the operation and performance of the semiconductor components meet the standards. When conducting electrical tests on semiconductor components, it is easy to cause problems such as uneven current configuration of the probe card and poor conductivity of the probes, especially when the design of signal shielding or current paths is poor. In this way, not only the stability of the transmitted electrical signal is affected, but also needle burning is easily caused.

Therefore, how to overcome the above-mentioned defects through the improvement of structural design has become an important issue to be solved in this field.

SUMMARY OF THE DISCLOSURE

The problem solved by the present disclosure is to provide a probe card structure. By dividing areas on guide plates, through holes of the guide plates, and plating conductive film on probes, the effect of faster conduction and uniform current distribution can be achieved. At the same time, the signal probes of the probe card share the ground point, and each of the signal probes is groundable.

To solve the above problem, the present disclosure provides a probe card structure, which includes at least one first guide plate, at least one second guide plate, and a plurality of contact elements. A plurality of contact elements include at least one signal probe and at least one ground probe. The at least one second guide plate is parallel to the at least one first guide plate, the at least one first guide plate has a plurality of first guide plate through holes, the second guide plate has a plurality of second guide plate through holes, and the plurality of second guide plate through holes respectively correspond to the plurality of first guide plate through holes. The plurality of first guide plate through holes have a first quantity of the first guide plate through holes and the plurality of second guide plate through holes have a first quantity of the second guide plate through holes, and the first quantity of the first guide plate through holes corresponds to the first quantity of the second guide plate through holes, the first quantity of the first guide plate through holes defines a first guide plate first area of the at least one first guide plate, and the first quantity of the second guide plate through holes defines a second guide plate first area of the at least one second guide plate, at least one of the first guide plate first area and the second guide plate first area is plated with a guide plate conductive film. The at least one signal probe correspondingly passes through one part of the first quantity of the first guide plate through holes and one part of the first quantity of the second guide plate through holes, wherein each of the signal probe is plated with a probe conductive film, and the probe conductive film is in electrically contact with the guide plate conductive film, wherein the probe conductive film and the signal probe are insulated from each other. The at least one ground probe correspondingly passes through another part of the first quantity of the first guide plate through holes and another part of the first quantity of the second guide plate through holes, and the at least one ground probe is adjacent to the at least one signal probe, the at least one ground probe is electrically connected to a ground point. At least one of the first guide plate through holes is plated with the guide plate conductive film, and the at least one of the second guide plate through holes is plated with the guide plate conductive film, so that the probe conductive film of the at least one signal probe is electrically connected with the ground probe.

In certain embodiments, multiple ground probes are provided, among the multiple ground probes adjacent to the at least one signal probe, only one of the multiple ground probes is electrically connected to the ground point.

In certain embodiments, the plurality of first guide plate through holes have a second quantity of the first guide plate through holes and the plurality of second guide plate through holes have a second quantity of the second guide plate through holes, and the second quantity of the first guide plate through holes corresponds to the second quantity of the second guide plate through holes, a sum of the first quantity of the first guide plate through holes and the second quantity of the first guide plate through holes is less than or equal to a total quantity of the plurality of first guide plate through holes, a sum of the first quantity of the second guide plate through holes and the second quantity of the second guide plate through holes is less than or equal to a total quantity of the plurality of second guide plate through holes.

In certain embodiments, the second quantity of the first guide plate through holes defines a first guide plate second area of the at least one first guide plate, and the second quantity of the second guide plate through holes defines a second guide plate second area of the at least one second guide plate, and at least one of the first guide plate second area and the second guide plate second area is plated with the guide plate conductive film.

In certain embodiments, the at least one signal probe correspondingly passes through one part of the second quantity of the first guide plate through holes and one part of the second quantity of the second guide plate through holes, the at least one ground probe correspondingly passes through another part of the second quantity of the first guide plate through holes and another part of the second quantity of the second guide plate through holes.

In certain embodiments, an insulating layer is disposed between the at least one signal probe and the probe conductive film.

In certain embodiments, the signal probe, the probe conductive film and the insulating layer jointly form a coaxial needle.

In certain embodiments, the coaxial needle and the at least one ground probe form a GSG shielding structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
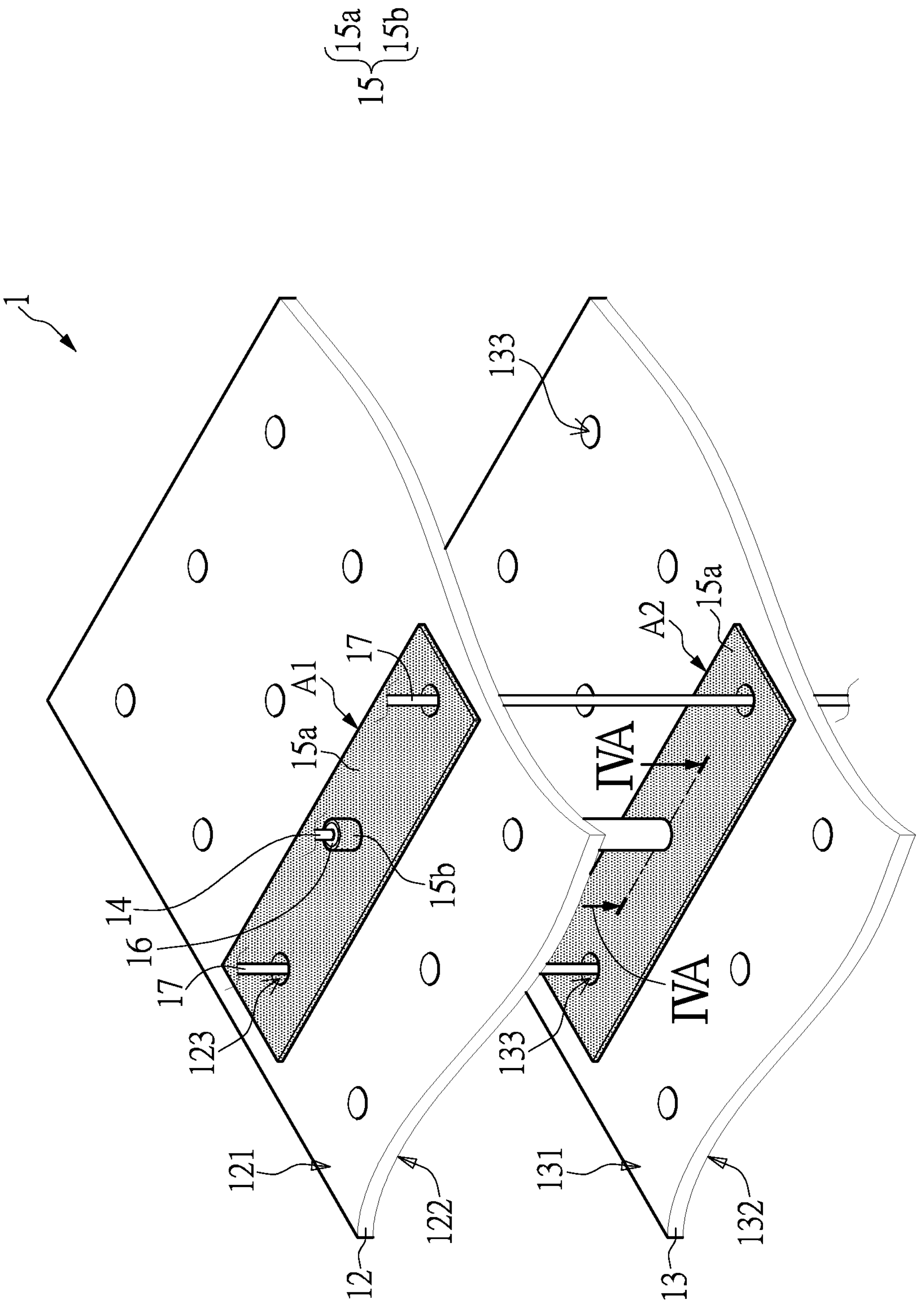
FIG. 1 is a schematic perspective view of a first embodiment of a probe card structure of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
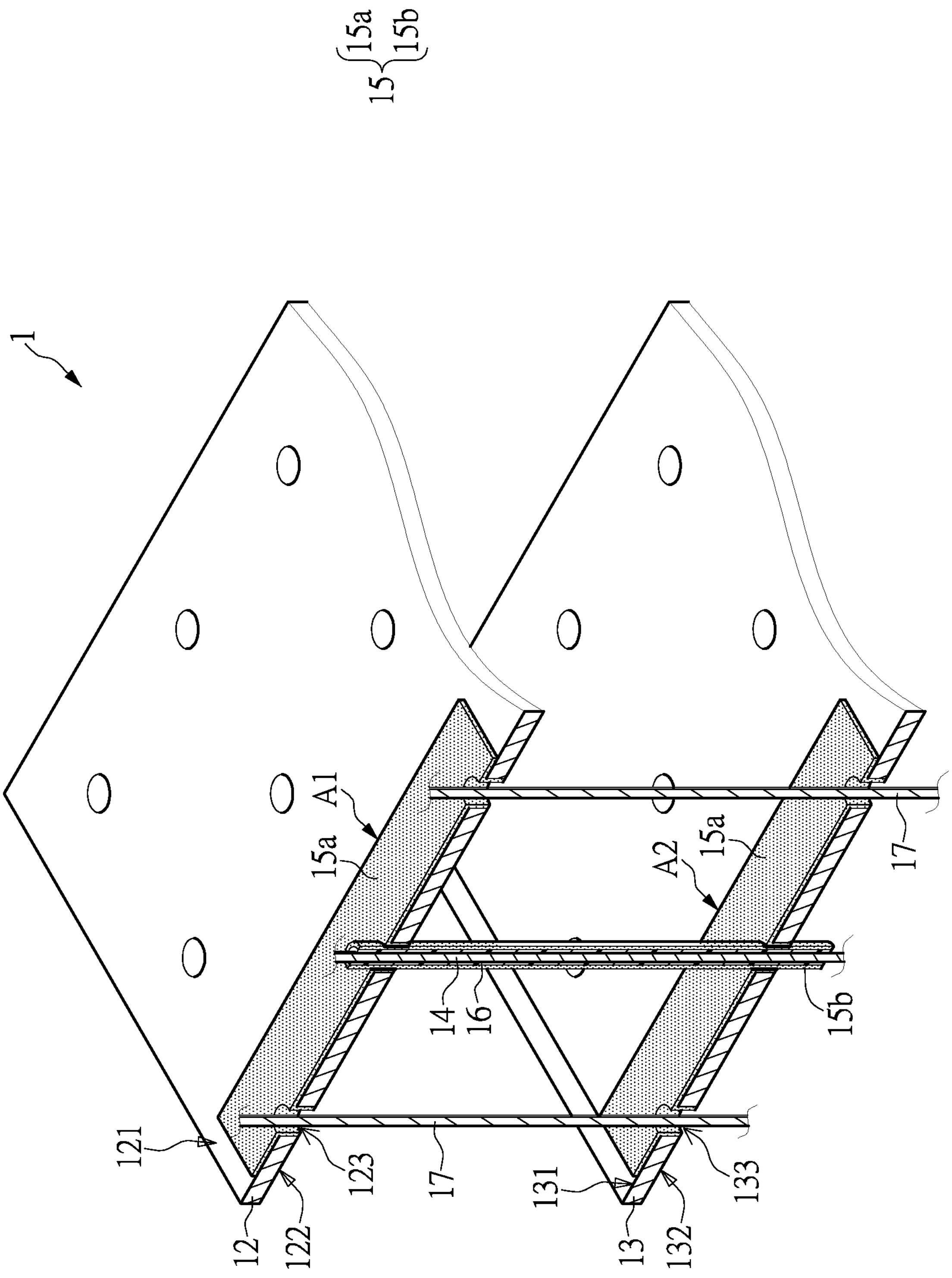
FIG. 2 is a cross-sectional perspective view taken along line III-III of the probe card structure in FIG. 1.
Figure 3:
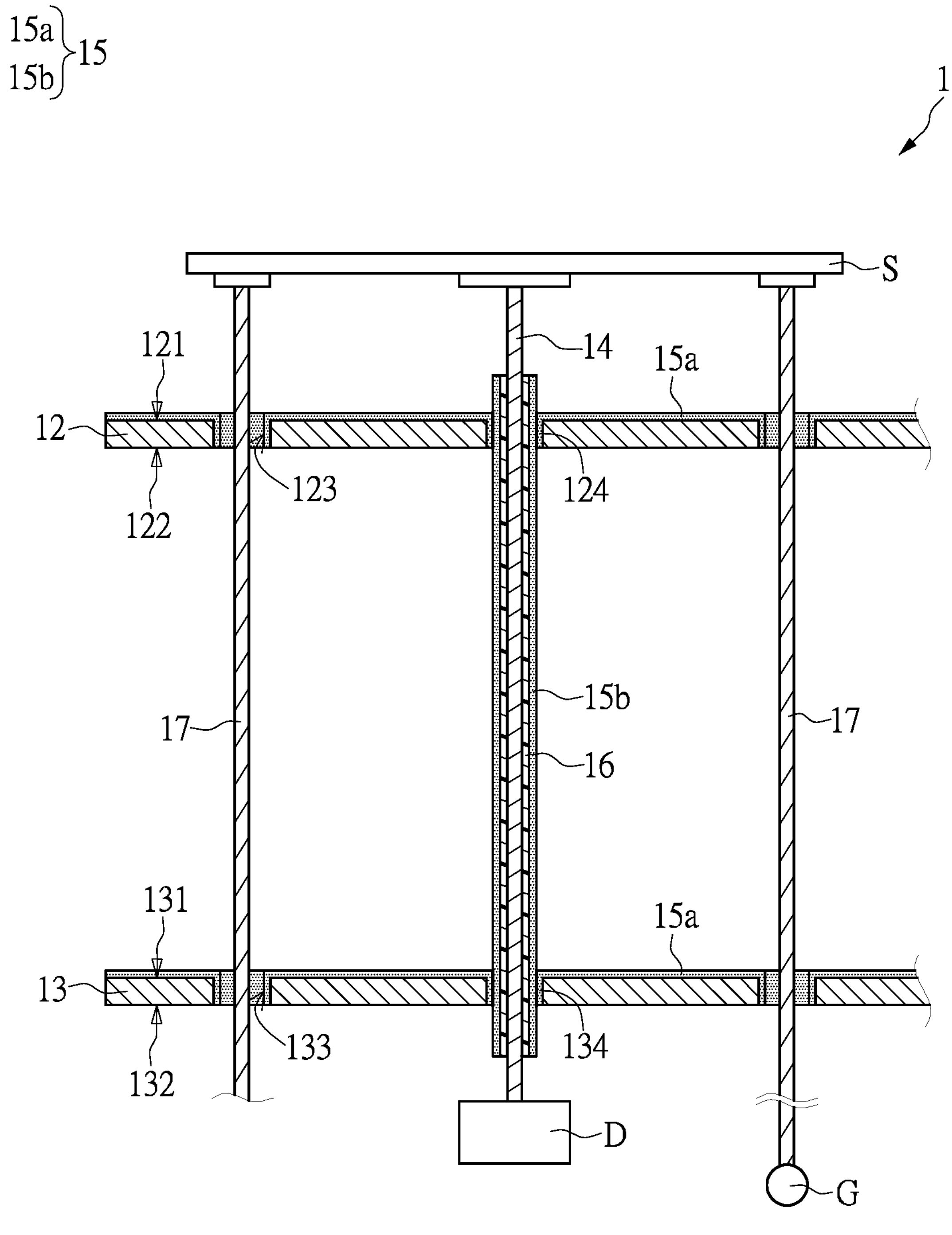
FIG. 3 is a schematic cross-sectional view of the first embodiment of the probe card structure of the present disclosure.

Referring to FIG. 1 to FIG. 4, FIG. 1 is a schematic perspective view of a first embodiment of a probe card structure 1 of the present disclosure; FIG. 2 is a cross-sectional perspective view taken along line III-III of the probe card structure 1 in FIG. 1; FIG. 3 is a schematic cross-sectional view of the first embodiment of the probe card structure 1 of the present disclosure.

In the first embodiment, as shown in FIG. 1 and FIG. 2, the probe card structure 1 of the present disclosure includes at least one first guide plate 12, at least one second guide plate 13 and a plurality of contact elements The plurality of contact elements include at least one signal probe 14 and at least one ground probe 17. The at least one first guide plate 12 has a first surface 121 and a second surface 122, the at least one second guide plate 13 has a third surface 131 and a fourth surface 132. The at least one second guide plate 13 is parallel to the at least one first guide plate 12, and the second surface 122 and the third surface 131 face each other. It should be noted that the quantity of the first guide plate 12 and the second guide plate 13 of the present disclosure can be adjusted according to the actual situation, which is not limited by the present disclosure.

In the first embodiment, the at least one first guide plate 12 has a plurality of first guide plate through holes 123; the at least one second guide plate 13 has a plurality of second guide plate through holes 133, and the plurality of second guide plate through holes 133 respectively correspond to the plurality of first guide plate through holes 123. The plurality of first guide plate through holes 123 have a first quantity of the first guide plate through holes 123 and the plurality of second guide plate through holes 133 have a first quantity of the second guide plate through holes 133, and the first quantity of the first guide plate through holes 123 corresponds to the first quantity of the second guide plate through holes 133. The first guide plate first area A1 defined by the first quantity of the first guide plate through holes 123 on at least one of the first surface 121 and the second surface 122 is plated with a guide plate conductive film 15*a*. The second guide plate first area A2 defined by the first quantity of the second guide plate through holes 133 on at least one of the third surface 131 and the fourth surface 132 is plated with the guide plate conductive film 15*a*. According to practical applications, at least one of the first guide plate first area A1 and the second guide plate first area A2 can be plated with the guide plate conductive film 15*a*. The signal probe 14 correspondingly passes through one part of the first quantity of the first guide plate through holes 123 and one part of the first quantity of the second guide plate through holes 133. The signal probe 14 is plated with a probe conductive film 15*b*, and the probe conductive film 15*b* is in electrically contact with the guide plate conductive film 15*a*.

Preferably, multiple ground probes are provided, among the multiple ground probes 17 adjacent to the at least one signal probe 14, only one of the multiple ground probes 17 is electrically connected to the ground point G.

In the first embodiment, as shown in FIG. 1 and FIG. 2, the first guide plate first area A1 at the first surface 121 and the second guide plate first area A2 at the third surface 131 are plated with the guide plate conductive film 15*a*, and the surface of the probe 14 is plated with the probe conductive film 15*b*. Depending on particular implementations, the at least one first guide plate 12 and the at least one second guide plate 13 can be selectively plated. That is, the first guide plate 12 can be plated with the guide plate conductive film 15*a* while the second guide plate 13 is not plated with the guide plate conductive film 15*a*; the second guide plate 13 can be plated with the guide plate conductive film 15*a* while the first guide plate 12 is not plated with the guide plate conductive film 15*a*; or any surface of the first guide plate 12 and the second guide plate 13 can be plated with the guide plate conductive film 15*a* (e.g. plating the guide plate conductive film 15*a* on the first surface 121 and not plating the guide plate conductive film 15*a* on the second surface 122, plating the guide plate conductive film 15*a* on the third surface 131 and not plating the guide plate conductive film 15*a* on the fourth surface 132), the present disclosure is not limited thereto.

In the first embodiment, as shown in FIG. 3, the ground probe 17 is adjacent to and parallel to the signal probe 14. One end of the ground probe 17 contacts the substrate S. One end of the signal probe 14 contacts the substrate S and another end of the signal probe 14 contacts the device under test D. In particular implementations, the quantity of the signal probes 14, the ground probes 17, the first guide plate through holes 123 and the second guide plate through holes 133 can be adjusted according to the situation, the present disclosure is not limited thereto. Preferably, an insulating layer 16 is disposed between the at least one signal probe 14 and the probe conductive film 15*b*. Depending on particular implementations, the material of the insulating layer 16 can be, but not limited to, polydimethylsiloxane, polyimide, or fluororesin insulating plating.

A contact surface between the probe conductive film 15*b* of the signal probe 14 and the first guide plate through holes 123 and the second guide plate through holes 124 have a contact point (124, 134). The probe conductive film 15*b* of the signal probe 14 contacts the contact point 124 of the first guide plate through holes 123 and the contact point 134 of the second guide plate through holes 133. The contact points (124, 134) are plated with the guide plate conductive film 15*a*, so that the probe conductive film 15*b* of the signal probe 14 is electrically connected to the ground probe 17.

Preferably, the guide plate conductive film 15*a* and the probe conductive film 15*b* are thin conductive films with a thickness less than 1 μm. Plating the conductive film 15 (guide plate conductive film 15*a* and probe conductive film 15*b*) can make the current distribution of the guide plate and the probe more uniform, and make the conduction faster, resulting in reduced probability of needle burning.

Figure 4A:
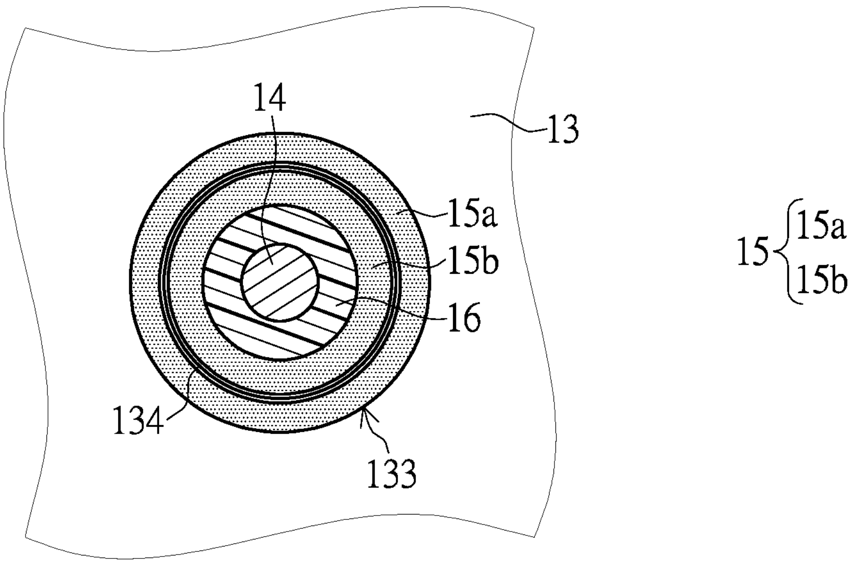
FIG. 4A is a schematic cross-sectional top view of a coaxial needle of the probe card structure of the present disclosure.
Figure 4B:
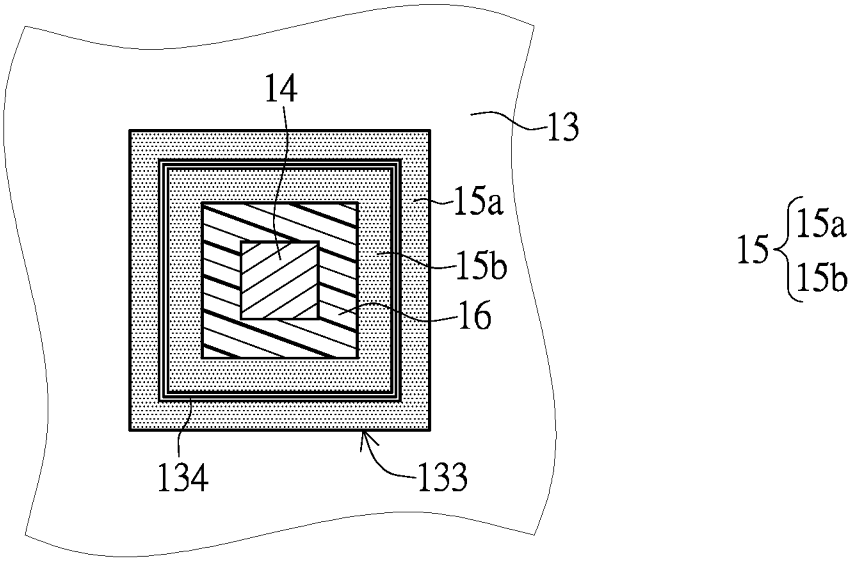
FIG. 4B is a schematic cross-sectional top view of another aspect of a coaxial needle of the probe card structure of the present disclosure.

Further, as shown in FIG. 4A and FIG. 4B, the signal probe 14, the probe conductive film 15*b* and the insulating layer 16 jointly form a coaxial needle. FIG. 4A is a schematic cross-sectional top view of a coaxial needle of the probe card structure 1 of the present disclosure; FIG. 4B is a schematic cross-sectional top view of another aspect of a coaxial needle of the probe card structure 1 of the present disclosure.

The cross section of the coaxial needle in FIG. 4A is circular, and the first guide plate through holes 123 is circular, and the coaxial needle is a cylinder; the cross section of the coaxial needle in FIG. 4B is square, and the first guide plate through holes 123 is square, and the coaxial needle is a rectangular prism. In particular implementations, the present disclosure does not limit the shapes of the first guide plate through holes 123, the second guide plate through holes 133 and the coaxial needle. The first guide plate through holes 123 and the second guide plate through holes 133 can be circular, square, rectangular, triangular or polygon, and the coaxial needle can be a cylinder, a rectangular prism, a triangular prism or a polyhedron. With the disposition of the coaxial needles, the conductivity can be greater.

Further, in the first embodiment, the inner surfaces of at least one first guide plate through holes 123 and the second guide plate through holes 133 are plated with a guide plate conductive film 15*a*. Preferably, the guide plate conductive film is only plated on the guide plates (first guide plate 12 or/and second guide plate 13) corresponding to the through holes (first guide plate through holes 123 or/and second guide plate through holes 133) plated with the guide plate conductive film 15*a*. In other words, if the guide plates (the first guide plate 12 or/and the second guide plate 13) are not plated with the guide plate conductive film 15*a*, the corresponding through holes (the first guide plate through holes 123 or/and the second guide plate through holes 133) may not be plated with the guide plate conductive film 15*a*, but the present disclosure is not limited thereto. The effect of plating the guide plate conductive film 15*a* onto the through holes (the first guide plate through holes 123 and/or the second guide plate through holes 133) is to enable the coaxial pins to have the functions of grounding and shielding signal interference. In this embodiment, the first guide plate 12 and the second guide plate 13, the signal probe 14, and the first guide plate through holes 123 and the second guide plate through holes 133 can be plated with conductive film 15 by electroplating or sputtering. The present disclosure does not limit any plating technology.

Second Embodiment

Figure 5:
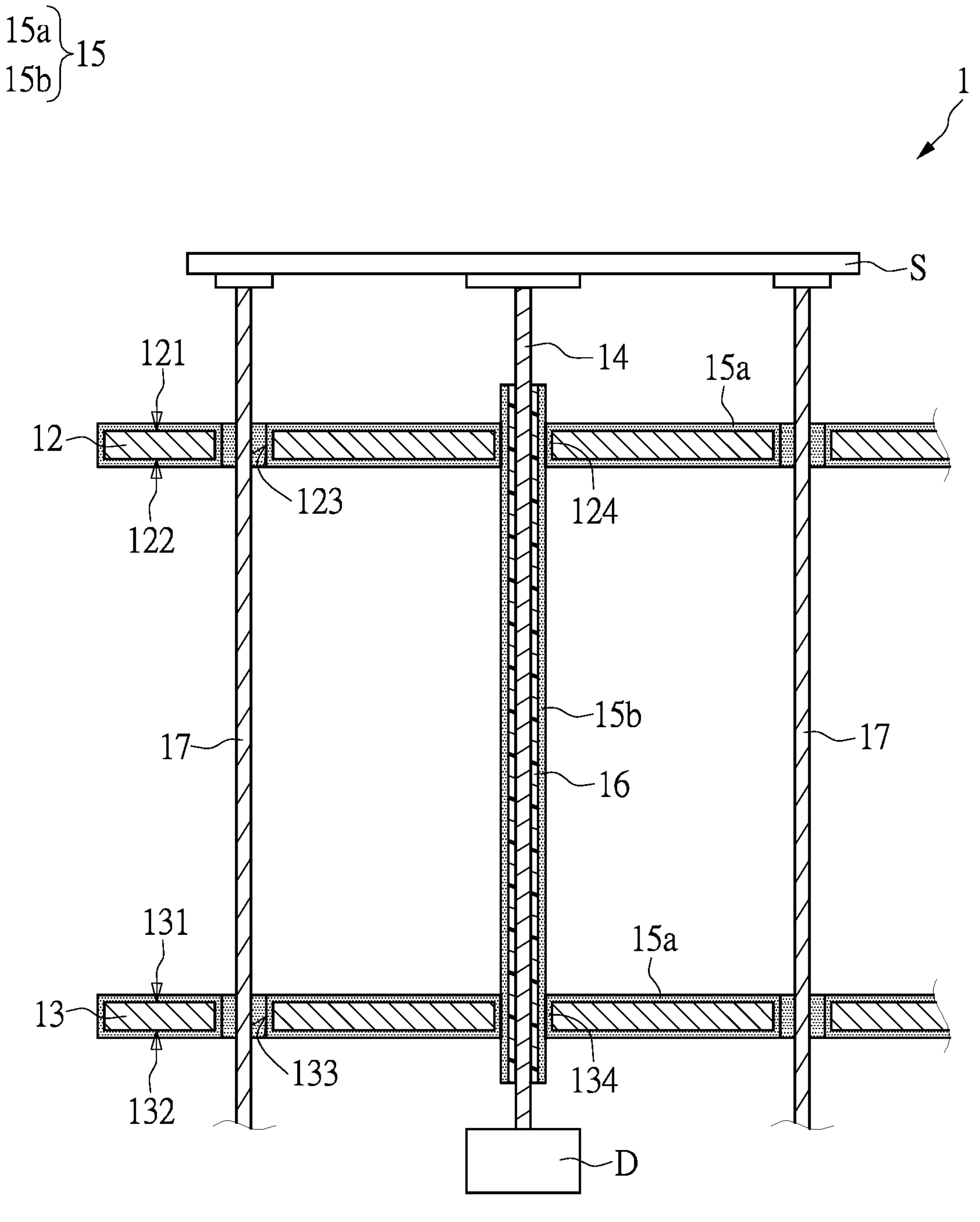
FIG. 5 is a schematic cross-sectional view of a second embodiment of the probe card structure of the present disclosure.

Referring to FIG. 5, FIG. 5 is a schematic cross-sectional view of a second embodiment of the probe card structure 1 of the present disclosure. A structure of the probe card structure 1 shown in FIG. 5 is substantially the same as that of the probe card structure 1 shown in FIG. 1, and the same parts will not be repeated here. The difference between the probe card structure 1 shown in FIG. 5 and the probe card structure 1 shown in FIG. 1 is that, the entire surfaces of the first guide plate 12 and the second guide plate 13 of the probe card structure 1 of the second embodiment are plated with the guide plate conductive film 15*a*, and the first guide plate through holes 123 and the second guide plate through holes 133 is respectively plated with the guide plate conductive film 15*a*.

Third Embodiment

Figure 6:
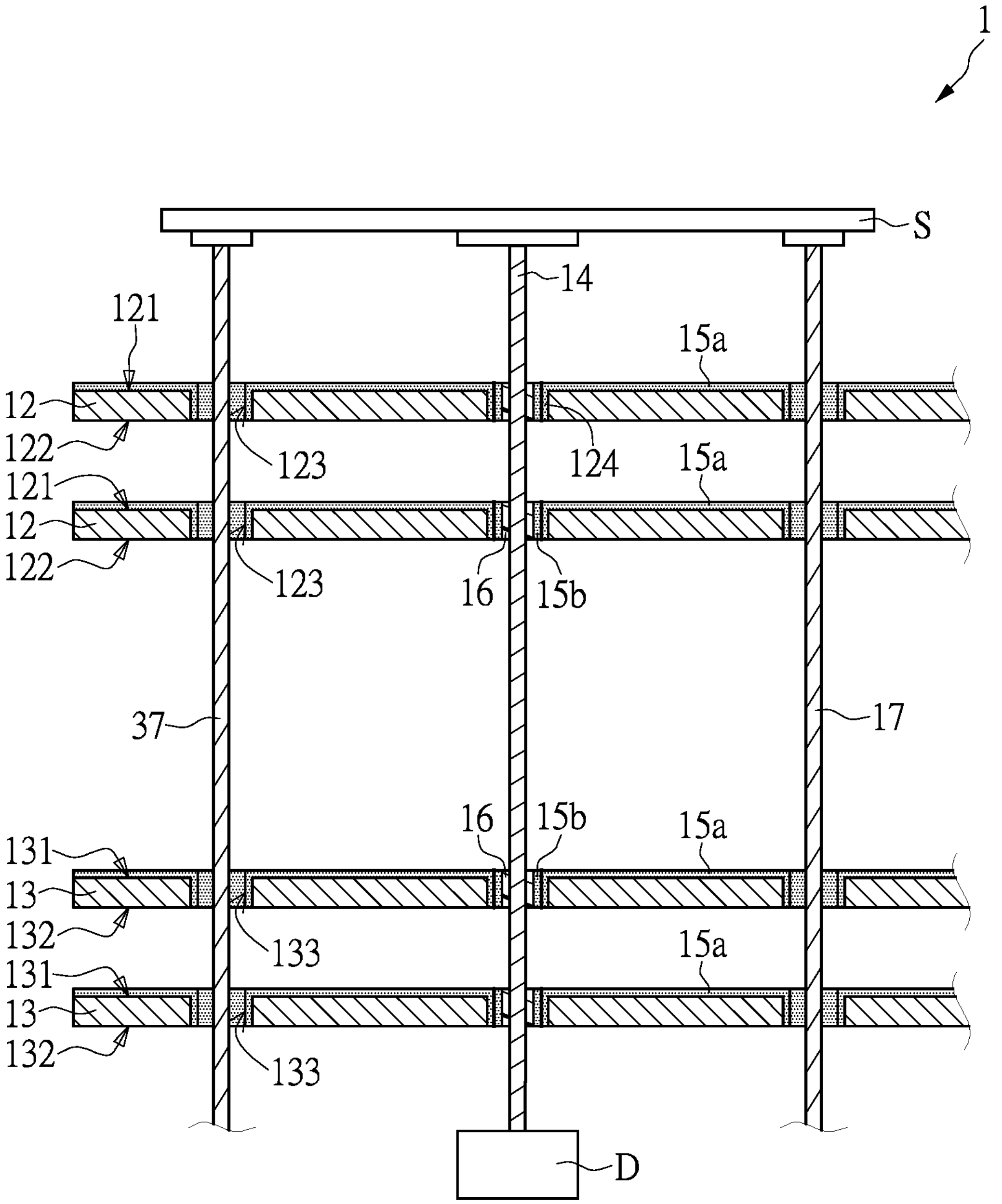
FIG. 6 is a schematic cross-sectional view of a third embodiment of the probe card structure of the present disclosure.

Referring to FIG. 6, FIG. 6 is a schematic cross-sectional view of a third embodiment of the probe card structure 1 of the present disclosure. A structure of the probe card structure 1 shown in FIG. 6 is substantially the same as that of the probe card structure 1 shown in FIG. 1, and the same parts will not be repeated here. There are two differences between the probe card structure 1 shown in FIG. 6 and the probe card structure 1 shown in FIG. 1. Firstly, the probe card structure 1 of the third embodiment has two first guide plates 12 and two second guide plates 13. As described above, the present disclosure does not limit the quantity of the first guide plate 12 and the second guide plate 13. The quantity of the first guide plate 12 and the second guide plate 13 can be adjusted according to the particular implementations, and can be one, two, three or more, respectively. Secondly, the probe conductive film 15*b* is only plated at the contact points (124, 134) of the signal probe 14 of the probe card structure 1 of the third embodiment, and the insulating layer 16 is also provided only between the signal probe 14 and the contact points (124, 134) plated with the probe conductive film 15*b*, so that the signal probe 14 can be grounded through the contact points (124, 134) of the probe conductive film 15*b* and the guide plate conductive film 15*a*.

Similarly, each of the thickness of thicknesses of the guide plate conductive film 15*a*, the thickness of the probe conductive film 15*b* and the thickness of the insulating layer 16 is less than 1 μm.

Fourth Embodiment

Figure 7:
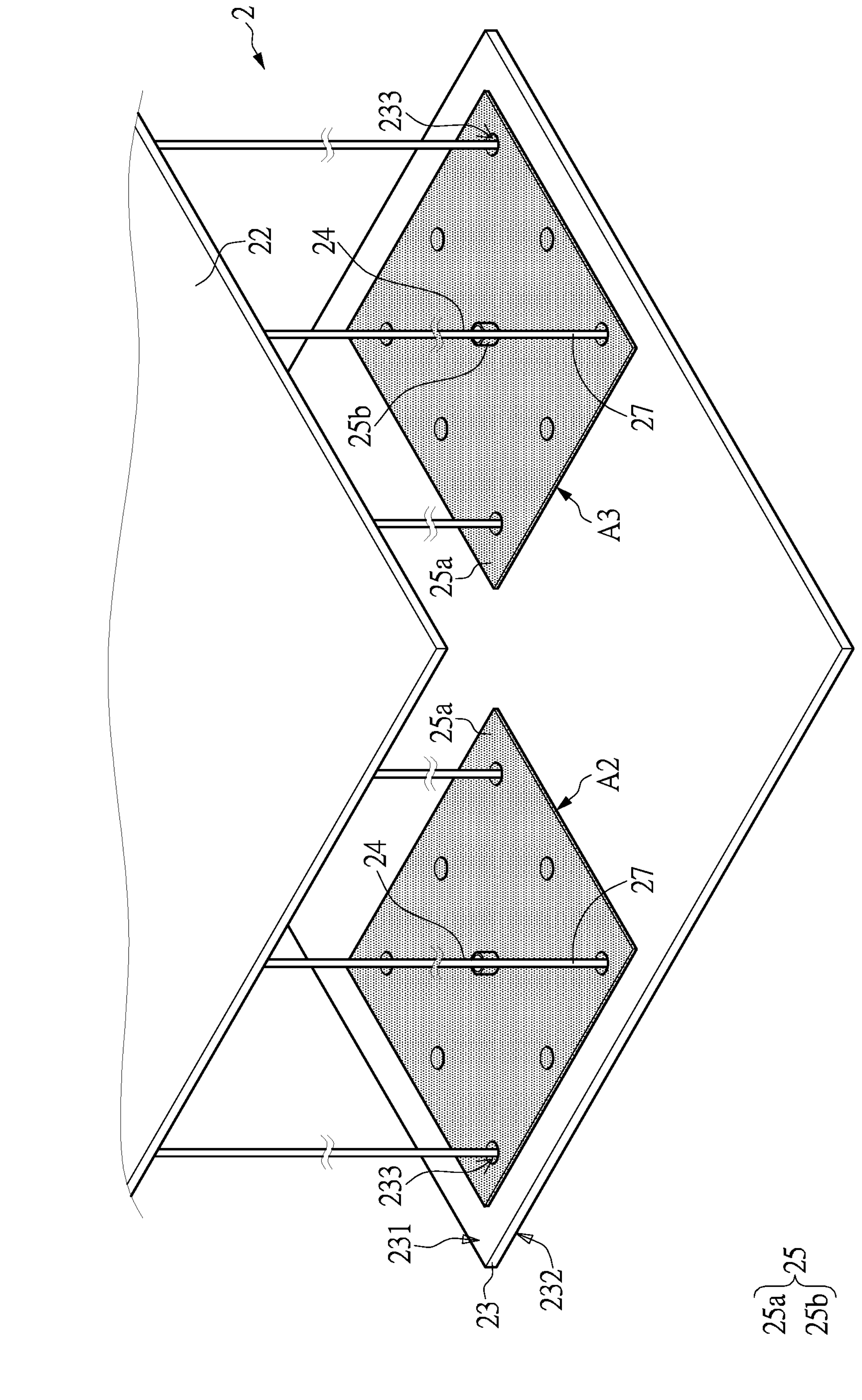
FIG. 7 is a schematic cross-sectional perspective view of a fourth embodiment of the probe card structure of the present disclosure.

Referring to FIG. 7, FIG. 7 is a schematic cross-sectional perspective view of a fourth embodiment of the probe card structure 2 of the present disclosure. A structure of the probe card structure 2 shown in FIG. 7 is substantially the same as that of the probe card structure 2 shown in FIG. 1, and the same parts will not be repeated here. The probe card structure 2 includes at least one first guide plate 22, at least one second guide plate 23 and a plurality of contact elements, the plurality of contact elements include at least one signal probe 24 and at least one ground probe 27. It should be noted that, the first guide plate through holes of the first guide plate 22 is omitted in FIG. 7, but actually the first guide plate through holes of the first guide plate 22 still exists in the fourth embodiment. The difference between the probe card structure 2 of the fourth embodiment and the probe card structure 1 of the first embodiment is that the plurality of second guide plate through holes 233 of the probe card structure 2 respectively have a first quantity of the second guide plate through holes 233 and a second quantity of the second guide plate through holes 233. The sum of the first quantity of the second guide plate through holes 233 and the second quantity of the second guide plate through holes 233 is less than or equal to the quantity of second guide plate through holes 233. The first quantity of the second guide plate through holes 233 defines the second guide plate first area A2 of the second guide plate, and the second quantity of the second guide plate through holes defines the second guide plate second area A3 of the second guide plate.

The first guide plate 22 may have a first guide plate first area and a first guide plate second area (not shown in FIG. 7); the second guide plate 23 may have a second guide plate first area A2 and a second guide plate second area A3. Specifically, FIG. 7 takes the second guide plate first area A2 and the second guide plate second area A3 at the second guide plate 23 as an example. Please note that FIG. 7 is only a schematic diagram. According to practical requirements, a guide plate conductive film 25*a* can be plated on any surface of the first surface and the second surface of the first guide plate 22 and the third surface 231 and the fourth surface 232 of the second guide plate 23, according to the selected first quantity of the first guide plate through holes which defines the first guide plate first area, the selected second quantity of the first guide plate through holes which defines the first guide plate second area, the selected first quantity of the second guide plate through holes which defines the second guide plate first area A2, and the selected second quantity of the second guide plate through holes 233 which defines the second guide plate second area A3. A contact point is formed by plating the guide plate conductive film 25*a* on the first guide plate through holes and the second guide plate through holes 233 which the signal probe 24 passes through.

It should be noted that, one of the first guide plate first area (not shown in FIG. 7) and the second guide plate first area A2 can be selected to be plated with guide plate conductive film 25*a*; one of the first guide plate second area (not shown in FIG. 7) and the second guide plate second area A3 can be selected to be plated with guide plate conductive film 25*a*, the present disclosure is not limited thereto.

It should be noted that, according to practical requirements, the first guide plate 22 may have other areas other than the first guide plate first area (not shown in FIG. 7) and the first guide plate second area (not shown in FIG. 7); the second guide plate 23 may also have other areas other than the second guide plate first area A2 and the second guide plate second area A3. The other areas may also include any quantity of the first guide plate through holes and the second guide plate through holes 233.

Similarly, the probe conductor film 25*b* of the signal probe 24 is connected to the contact point of the guide plate conductor film 25*a* for grounding. Plating the conductive film 15 (guide plate conductive film 15*a* and probe conductive film 15*b*) can make the current distribution of the guide plate and the probe more uniform, and make the conduction faster, resulting in reduced probability of needle burning.

Further, the contact elements included in the first guide plate first area are correspondingly insulated from the contact elements included in the first guide plate second area; the contact elements included in the second guide plate first area A2 are correspondingly insulated from the contact elements included in the second guide plate second area A3.

Furthermore, as shown in FIG. 7, the second guide plate first area A2 and the second guide plate second area A3 can be regarded as a 3×3 array with 9 second guide plate through holes. The second guide plate first area A2 and the second guide plate second area A3 may be provided with one signal probe 24 and four ground probes 27, respectively. The signal probe 24 is arranged in the center of the 3×3 array, and each of the four grounded probes 27 is arranged in a diagonal position of signal probe 24.

It should be noted that, in the fourth embodiment, the quantity, configuration and arrangement of the signal probes 24 and the grounding probes 27 depend on actual needs. The quantity of the first guide plate first area, the first guide plate second area, the second guide plate first area A2 and the second guide plate second area A3 can be more than two, respectively.

The shielding effect can be improved by the probe card structure 2 of the fourth embodiment of the present disclosure.

Beneficial Effects of the Embodiments

One of the beneficial effects of the present disclosure is that, in probe card structure provided by the present disclosure by virtue of coating the areas on the guide plates and the signal probes with conductive films, and setting insulating layers between the signal probes and the conductive films to form coaxial needles, resulting in even current distribution, faster conduction, suppression of signal degradation, and effective reduction of needle burning. Another beneficial effect is that, the GSG shielding structure is formed by the adjacent arrangement of the coaxial needle and the ground probe, which can achieve the shielding effect of reducing signal interference, thereby achieving accurate signal transmission.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card structure, comprising:

at least one first guide plate;

at least one second guide plate, the at least one second guide plate being spaced apart from and parallel to the at least one first guide plate;

wherein the at least one first guide plate has a plurality of first guide plate through holes, the at least one second guide plate has a plurality of second guide plate through holes, and the plurality of second guide plate through holes respectively correspond to the plurality of first guide plate through holes;

wherein the plurality of first guide plate through holes have a first quantity of the first guide plate through holes and the plurality of second guide plate through holes have a first quantity of the second guide plate through holes, and the first quantity of the first guide plate through holes corresponds to the first quantity of the second guide plate through holes, the first quantity of the first guide plate through holes defines a first guide plate first area of the at least one first guide plate, and the first quantity of the second guide plate through holes defines a second guide plate first area of the at least one second guide plate, at least one of the first guide plate first area and the second guide plate first area is plated with a guide plate conductive film, and a plurality of contact elements including:

at least one signal probe, the at least one signal probe correspondingly passing through one part of the first quantity of the first guide plate through holes and one part of the first quantity of the second guide plate through holes, wherein each of the at least one signal probe is plated with a probe conductive film, and the probe conductive film is in electrically contact with the guide plate conductive film, wherein the probe conductive film and the signal probe are insulated from each other; and at least one ground probe, the at least one ground probe correspondingly passing through another part of the first quantity of the first guide plate through holes and another part of the first quantity of the second guide plate through holes, and the at least one ground probe being adjacent to the at least one signal probe;

wherein at least one of the ground probe is electrically connected to a ground point; wherein at least one of the first guide plate through hole or at least one of the second guide plate through hole is plated with the guide plate conductive film, so that the probe conductive film of the signal probe is electrically connected with the ground probe;

wherein the plurality of first guide plate through holes have a second quantity of the first guide plate through holes and the plurality of second guide plate through holes have a second quantity of the second guide plate through holes, and the second quantity of the first guide plate through holes corresponds to the second quantity of the second guide plate through holes, wherein a sum of the first quantity of the first guide plate through holes and the second quantity of the first guide plate through holes is less than or equal to a total quantity of the plurality of first guide plate through holes, a sum of the first quantity of the second guide plate through holes and the second quantity of the second guide plate through holes is less than or equal to a total quantity of the plurality of second guide plate through holes;

wherein the second quantity of the first guide plate through holes defines a first guide plate second area of the at least one first guide plate, the second quantity of the second guide plate through holes defines a second guide plate second area of the at least one second guide plate, and at least one of the first guide plate second area and the second guide plate second area is plated with the guide plate conductive film;

wherein another at least one signal probe correspondingly passes through one part of the second quantity of the first guide plate through holes and one part of the second quantity of the second guide plate through holes, another at least one ground probe correspondingly passes through another part of the second quantity of the first guide plate through holes and another part of the second quantity of the second guide plate through holes;

wherein the at least one ground probe of the first guide plate first area and the probe conductive film of the at least one signal probe are electrically connected to each other; the another at least one ground probe of the first guide plate second area and the probe conductive film of the another at least one signal probe are electrically connected to each other; the at least one ground probe of the second guide plate first area and the probe conductive film of the at least one signal probe are electrically connected to each other; the another at least one ground probe of the second guide plate second area and the probe conductive film of the another at least one signal probe are electrically connected to each other;

wherein the contact elements included in the first guide plate first area are correspondingly insulated from the contact elements included in the first guide plate second area; and wherein the contact elements included in the second guide plate first area are correspondingly insulated from the contact elements included in the second guide plate second area.

2. The probe card structure according to claim 1, wherein an insulating layer is disposed between the at least one signal probe and the probe conductive film.

3. The probe card structure according to claim 2, wherein the at least one signal probe, the probe conductive film and the insulating layer jointly form a coaxial needle.

4. The probe card structure according to claim 3, wherein each of a thickness of the guide plate conductive film, a thickness of the probe conductive film and a thickness of the insulating layer is less than 1 μm.

5. The probe card structure according to claim 1, wherein a contact surface between the probe conductive film of the at least one signal probe and the first guide plate through holes and the second guide plate through holes have a contact point, and the contact point is plated with the guide plate conductive film.

6. The probe card structure according to claim 1, wherein the at least one ground probe or the at least one signal probe correspondingly passes through the another part of the first quantity of the first guide plate through holes and the another part of the first quantity of the second guide plate through holes.

* * * * *